US007859877B2

(12) United States Patent
Mondaeev

(10) Patent No.: US 7,859,877 B2
(45) Date of Patent: Dec. 28, 2010

(54) APPARATUS TO DETECT PATTERNS IN DATA

(75) Inventor: Maxim Mondaeev, Givat-Ella (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 218 days.

(21) Appl. No.: 12/029,299

(22) Filed: Feb. 11, 2008

(65) Prior Publication Data

US 2008/0192523 A1    Aug. 14, 2008

Related U.S. Application Data

(60) Provisional application No. 60/889,454, filed on Feb. 12, 2007.

(51) Int. Cl.
*G11C 15/00* (2006.01)
(52) U.S. Cl. .................. 365/49.1; 365/49.16; 365/49.17
(58) Field of Classification Search ................ 365/49.1, 365/49.17, 49.18
See application file for complete search history.

(56) References Cited

U.S. PATENT DOCUMENTS

| 6,137,707 | A | 10/2000 | Srinivasan et al. | |
| 6,856,527 | B1* | 2/2005 | Srinivasan et al. | 365/49.1 |
| 6,901,000 | B1* | 5/2005 | Ichiriu et al. | 365/49.17 |
| 7,440,304 | B1* | 10/2008 | Raj | 365/49.1 |
| 7,555,593 | B1* | 6/2009 | Rosman | 711/108 |

OTHER PUBLICATIONS

Pagiamtzis et al., "Content-Addressable Memory (CAM) Circuits and Architectures: A Tutorial and Survey," *IEEE Journal of Solid-State Circuits*, vol. 31, No. 3, pp. 712-727, Mar. 2006.

* cited by examiner

*Primary Examiner*—Pho M Luu

(57) ABSTRACT

In a method for detecting patterns, a plurality of data patterns is stored in a memory, and a data block from a stream of data is received. A first subset of the data block is compared in parallel to the plurality of data patterns. A second subset of the data block is compared in parallel to the plurality of data patterns, wherein the second subset partially overlaps the first subset. At least one signal is generated that indicates a detected data pattern in the data block.

21 Claims, 12 Drawing Sheets

APPARATUS TO DETECT PATTERNS IN DATA

CROSS-REFERENCES TO RELATED APPLICATIONS

The present application claims the benefit of U.S. Provisional Application No. 60/889,454, entitled "COMPARE SIMULTANEOUSLY MULTIPLE SHIFTED WINDOWS OF A PATTERN WITH A CONTENT ADDRESSABLE MEMORY," filed on Feb. 12, 2007, which is hereby incorporated by reference herein in its entirety.

FIELD OF TECHNOLOGY

The present disclosure relates generally to digital circuits, and more particularly, to circuits for detecting patterns in data.

BACKGROUND

A content addressable memory (CAM) is a type of computer memory that allows for high speed searches of a specific data pattern within its memory cells, which are organized as an array having rows and columns. A different data pattern may be stored in each row of the CAM. Data to be checked can be supplied to an input of the CAM, and the CAM may then compare the input to each row of the CAM array. If the CAM determines that the input matches one or more rows, the CAM returns a signal indicating the row or rows that match.

A CAM may be used to determine whether a certain data pattern is in a stream of data, such as data read from a hard disk drive or data received via a network. This may be useful for virus detection, for example. For instance, the stream of data may be analyzed to determine if it includes any data patterns that match any of the entries in a list (dictionary) of known virus patterns. The rows of the CAM array may store the known patterns, and non-overlapping blocks of the stream of data could be serially provided to the CAM in a block-wise manner so that each block is compared with the known patterns in the rows of the CAM array. To accommodate multiple possible different positions of a known pattern in a block of data wider than the known pattern, a ternary CAM (TCAM) with a width corresponding to the data block width is utilized, and the known pattern is stored in multiple entries corresponding to the multiple possible different positions, with "don't care" bits filling the remaining bits of each entry. Upon detection of a pattern match, desired actions could be taken such as further analysis, repair, quarantine, or deletion of the data containing the virus.

SUMMARY OF THE DISCLOSURE

In one embodiment, a method for detecting patterns includes storing a plurality of data patterns in a memory, and receiving a data block from a stream of data. The method also includes comparing in parallel a first subset of the data block to the plurality of data patterns, and comparing in parallel a second subset of the data block to the plurality of data patterns, wherein the second subset partially overlaps the first subset. The method additionally includes generating at least one signal that indicates a detected data pattern in the data block.

In another embodiment, an apparatus for detecting patterns in a stream of data comprises a memory to store a plurality of data patterns, and an interface to select data from the stream of data. Additionally, the apparatus comprises a compare logic block coupled to the memory and the interface to compare a plurality of partially overlapping subsets of a data block from the stream of data with all of the plurality of data patterns and to generate at least one signal to indicate whether at least one of the data patterns was detected in the data block.

In yet another embodiment, a method for detecting patterns includes receiving a plurality of data patterns, and storing each data pattern in a corresponding row of a memory, wherein the rows of the memory have a width of at least W bytes, wherein W is a positive integer. Also, the method includes determining a data block in a stream of data, the data block having a width of W+M−1 bytes, wherein M is a positive integer. Additionally, the method includes comparing substantially simultaneously M different subsets of the data block to the plurality of data patterns, wherein each subset has a width of W bytes. Further, the method includes generating at least one signal to indicate whether at least one of the plurality of data patterns was detected in the data block.

In still another embodiment, an apparatus for detecting patterns in a stream of data comprises a memory having rows to store a plurality of data patterns, wherein the rows of the memory have a width of at least W bytes, wherein W is a positive integer. The apparatus also comprises an interface to select a data block from the stream of data, the data block having a width of W+M−1, wherein M is a positive integer. Additionally, the apparatus comprises a compare logic block coupled to the memory and the interface to compare in parallel M different subsets of the data block to the plurality of data patterns and to generate at least one signal to indicate whether at least one of the data patterns was detected in the data block. Each subset has a width of W bytes.

In a further embodiment, an apparatus for detecting patterns in a stream of data comprises a memory having rows to store a plurality of data patterns, and a subset selector to select subsets of the stream of data. Additionally, the apparatus comprises a compare logic block coupled to the memory and the subset selector, the compare logic including a plurality of compare modules for each row in the memory, wherein the compare logic block is configured to compare simultaneously, in parallel, a plurality of the subsets to the plurality of data patterns.

DETAILED DESCRIPTION

Figure 1:
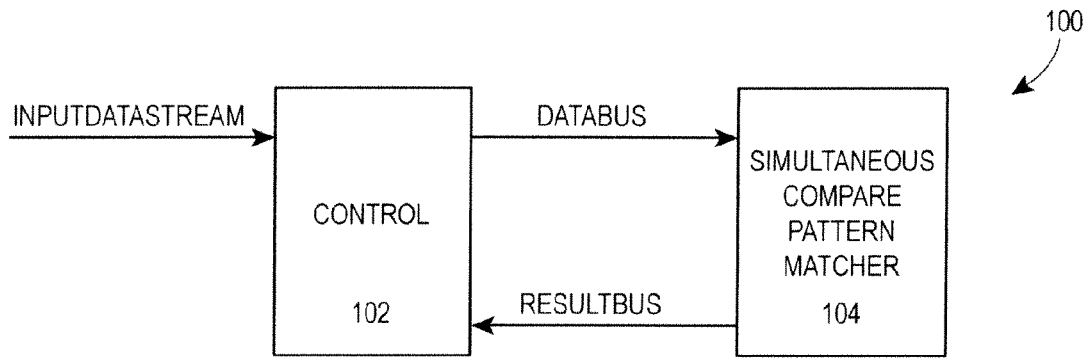
FIG. 1 is a block diagram of an example system for detecting a pattern in a stream of data.

FIG. 1 is a block diagram of an example system 100 for detecting a pattern in a stream of data. The stream of data could be data read from a storage device such as a hard disk drive (HDD), a digital versatile disk (DVD), etc. The stream of data also could be data received from a transmission via a point-to-point communication connection, a network such as a wired local area network (LAN), a wireless LAN, a wide area network (WAN), a broadband wireless network, a cellular network, etc. Thus, the stream of data could include a stream of packets.

The system 100 could be utilized in a variety of contexts. For example, the system 100 could be part of a security system that detects viruses, malicious network attacks, etc. It could also be used as part of a system that detects uses of particular applications or the transmission of confidential data. As yet another example, it could be used as part of a parsing system, a quality of service (QoS) queuing system related to different priority data, etc.

The system 100 includes a controller 102 and a simultaneous compare pattern matcher 104, which will be described in more detail below. The controller 102 is configured to configure the pattern matcher 104 and take actions based on whether a pattern is detected in the stream of data. For instance, if the system 100 is part of a virus checking system, the controller 102 may cause portions of the stream of data to be quarantined, initiate further analysis of the data, etc., if a virus pattern is detected. If the system 100 is for use in other contexts, the controller perform a variety of functions such as initiating further analysis of the data stream, parsing a packet, sending a packet to a particular queue, quarantining data, halting transmissions, etc.

The controller 102 may receive a data stream (INPUTDATASTREAM), which may be a signal received from a data storage device, a network, a point-to-point communication connection, etc. The controller 102 may process and/or handle the INPUTDATASTREAM. For example, the controller 102 may control whether the INPUTDATASTREAM or portions of the INPUTDATASTREAM are further processed, forwarded to other systems, etc. The controller 102 may send data received from the INPUTDATASTREAM to the pattern matcher 104 without first altering the data. Alternatively, the controller 102 may alter the data received from the INPUTDATASTREAM prior to sending it to the pattern matcher 104.

The controller 102 may send configuration signals and data signals to the pattern matcher 104 over a bus DATABUS. These signals may comprise data to be stored in a memory portion of the pattern matcher 104 (i.e., configuration signals) and/or data to be compared against the data stored in the array portion of the pattern matcher 104 (i.e., data signals). More specifically, as a part of a pattern detection system such as a virus checking system, the DATABUS could be used for sending known virus patterns for storage in the pattern matcher 104 and also for sending data that is to be analyzed to determine whether it includes any known virus patterns. In another implementation, the signal INPUTDATASTREAM may be coupled directly to an input of pattern matcher 104 in addition to or instead of being coupled to the controller 102. Other configuration signals may include one or more of signals determining whether the pattern matcher 104 should operate or not operate, the speed at which it runs, any known patterns to be stored in the memory portion of the pattern matcher 104, etc.

Although the DATABUS may be used for sending both configuration signals and data signals to the pattern matcher 104, in another implementation, the system 100 may include a first bus for sending configuration signals to configure the pattern matcher 104 and a second, separate bus for data to be compared against the data stored in the array portion of pattern matcher 104.

The results of the comparison operations performed by the pattern matcher 104 may be returned to the controller 102 on the bus RESULTBUS. Although the DATABUS and the RESULTBUS are shown as separate busses, one of ordinary skill in the art will appreciate that these busses also may be a single bus that is shared, time multiplexed, etc. Also, the DATABUS and/or the RESULTBUS could be expanded over three or more busses in other implementations. For example, the DATABUS could be expanded into two busses: a first to send data and a second to send control signals.

Figure 2:
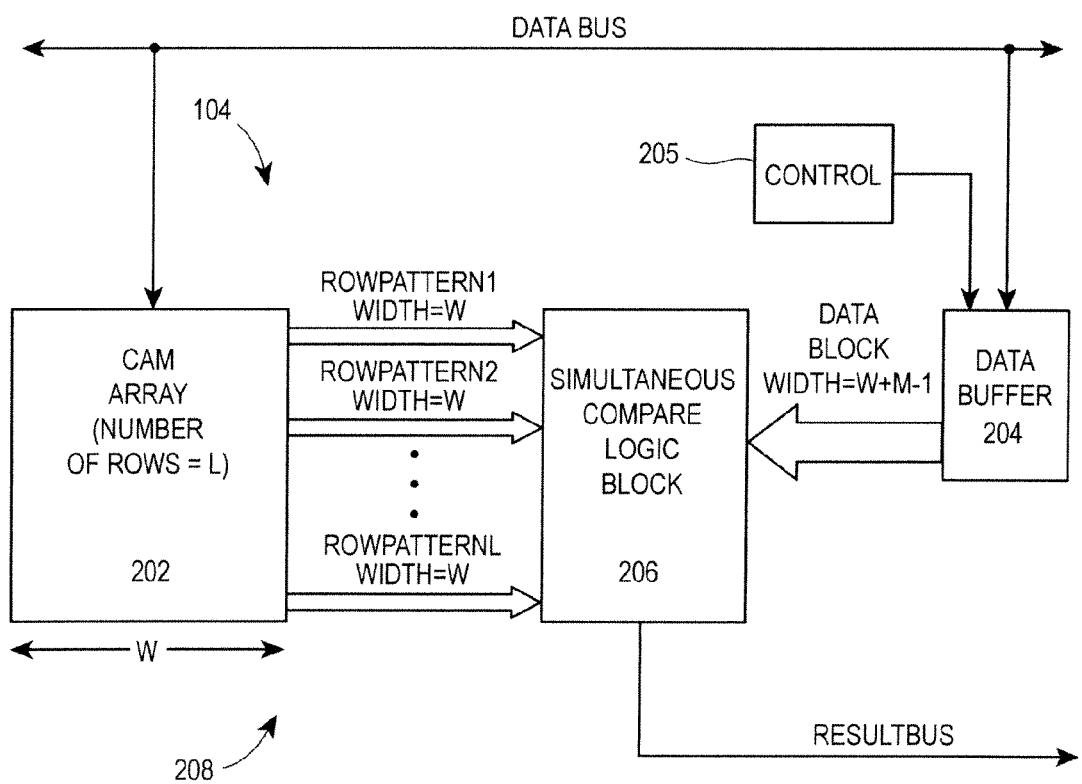
FIG. 2 is a block diagram of an example pattern matcher that could be utilized in the system of FIG. 1.

FIG. 2 is a block diagram of an example simultaneous compare pattern matcher 104 of FIG. 1. The pattern matcher 104 includes a memory array 202 that stores data patterns within L rows of memory cells, L being a positive integer. The memory 202 is coupled to a compare logic block 206 and provides data patterns stored in its memory cells to the compare logic 206. Each row of the memory 202 may have a width of W, W being a positive integer. The width W is an indicator of the number of data units (e.g., bits, bytes, etc.) capable of being stored in each row of the memory 202. For example, W may indicate a number of bytes.

In the embodiment of FIG. 2, the memory 202 may perform operations in response to control signals sent over the bus DATABUS. The control signals sent over bus DATABUS could indicate, for example, when the memory 202 should store data on the DATABUS within its memory cells. In an alternative embodiment, the memory 202 may not rely on the control signals provided on bus DATABUS to determine when to perform the operations discussed above. Additionally or alternatively, the memory 202 could perform predetermined operations in response to an internal timing circuit, state machine, etc.

As discussed above, the memory 202 provides data stored in its memory to the compare logic 206. In particular, the memory 202 provides each data pattern stored in each of its rows over L row pattern busses, ROWPATTERN1, ROWPATTERN2, ..., ROWPATTERNL to the compare logic block 206. Each of the row pattern busses has a width of W corresponding to the width of each of the rows of memory 202. In this embodiment, all row patterns stored in the memory 202 may be provided substantially simultaneously and in parallel to the compare logic 206. In an alternative embodiment, the number of row pattern busses may be less than the number of rows in memory 202 (i.e., number of pattern busses is less than L). In such an embodiment, all L rows of memory 202 may not be provided simultaneously but rather at differing times along the fewer number of row pattern busses. The memory 202 and the simultaneous compare logic block 206 may be components of a modified CAM or TCAM 208. As will be described in more detail subsequently, in one embodiment, each row of the memory 202 may have associated therewith a plurality of comparators (in the simultaneous compare logic block 206) so that multiple different subsets of a data block having a width greater than W can be compared in parallel and substantially simultaneously (e.g., in one compare cycle of the CAM/TCAM 208) to the pattern stored in the row.

The pattern matcher 104 may also include a data buffer 204 that may be used to store data that is to be analyzed. In this embodiment, the data buffer 204 may perform operations in response to control signals sent over the bus DATABUS. A controller 205 is coupled to the data buffer 204 and may generate control signals to control the data buffer 204. For example, the control signals could control when the data buffer 204 stores the data signals carried on the DATABUS. The controller 205 may itself receive control signals sent over bus DATABUS, for example, to indicate when the controller 205 should perform certain operations.

Portions of data stored in the data buffer 204 may be provided to the compare logic 206 via a bus DATABLOCK having a width that is greater than W. In one implementation described below, the width of the DATABLOCK is equal to W+M−1, where M is a positive integer and where the compare logic simultaneously compares each of M different subsets of the DATABLOCK, each having a width W, to each of the rows of the memory 202. In this embodiment, each subset is offset by one data unit from at least one other data unit. For example, a first data unit may include bytes 0 through W−1; a second data unit may include bytes 1 through W; a third data unit may include bytes 2 through W+1; a fourth data unit may include bytes 3 through W+2; etc. In other embodiments, each subset can be offset from the next subset by more than one unit, and the amount of the offset need not be uniform. For example, in a system that compares three different subsets, a first subset may include bytes 0 through W−1; a second data unit may include bytes 3 through W+2; and a third data unit may include bytes 10 through W+9; etc. Referring again to the embodiment of FIG. 2, the width of data stored in the data buffer 204 may be greater than W+M−1. In such implementations, the particular W+M−1 data units that are supplied on the DATABLOCK may be controlled by the controller 205. The data buffer 204 and the controller 205 may act as an interface to provide blocks of W+M−1 data units from a data stream sent via the DATABUS.

In some implementations, the data buffer 204 may be replaced with circuitry, controlled by the controller 205, that causes particular blocks of W+M−1 data units from the DATABUS to be supplied to the compare logic 206. In such an embodiment, the pattern matcher 104 may omit memory for storing the data block that is to be compared to the patterns in the memory array 202. In another embodiment, each row of the memory 202 may have associated therewith one comparator (in the simultaneous compare logic block 206) wherein multiple different subsets of the data block (with width greater than W) can be compared serially (e.g., in multiple compare cycles of the CAM/TCAM 208) in a block-wise manner to the pattern stored in the row. In such an embodiment, the data buffer 204 may include circuitry for serially providing different subsets of the DATABLOCK in a block-wise manner to the compare logic block 206. For example, during each of a plurality of compare cycles of the CAM/TCAM 208, a different subset of the DATABLOCK may be provided as a block to the compare logic block 206.

Referring again to the embodiment of FIG. 2, the compare logic 206 simultaneously compares multiple subsets of a data block provided along the bus DATABLOCK with each of L row patterns provided by CAM 202. For example, in one implementation described below, the width of the DATABLOCK is W+M−1, and the compare logic simultaneously compares each of M different subsets of the data block with all of the row patterns of the memory 202. In this embodiment, each subset is offset by one data unit from the immediately adjacent subset or subsets. In other embodiments, each subset can be offset from the immediately adjacent subset by more than one unit, and the amount of the offset need not be uniform.

In another embodiment, the compare logic 206 may have less bus inputs for the row patterns of memory 202. In such an embodiment, the number of row pattern busses ROWPATTERN1, ROWPATTERN2, etc., may be less than L, and row patterns may be sent to the compare logic 206 by time sharing the fewer row pattern busses. In this embodiment, the compare logic 206 may simultaneously compare multiple subsets of a data block provided along the bus DATABLOCK with each of P row patterns provided by CAM 202, where P is less than L.

The compare logic 206 generates signals that indicate the results of its comparison operations, and signals are provided on a bus RESULTBUS. The results could comprise several types of data such as one or more of the row indices of the matching row patterns, the matching row patterns themselves, indications of the matching data blocks, etc. When results have been generated, the controller 205 may cause a different block of W+M−1 data units to be supplied on the DATABLOCK bus.

Figure 3:
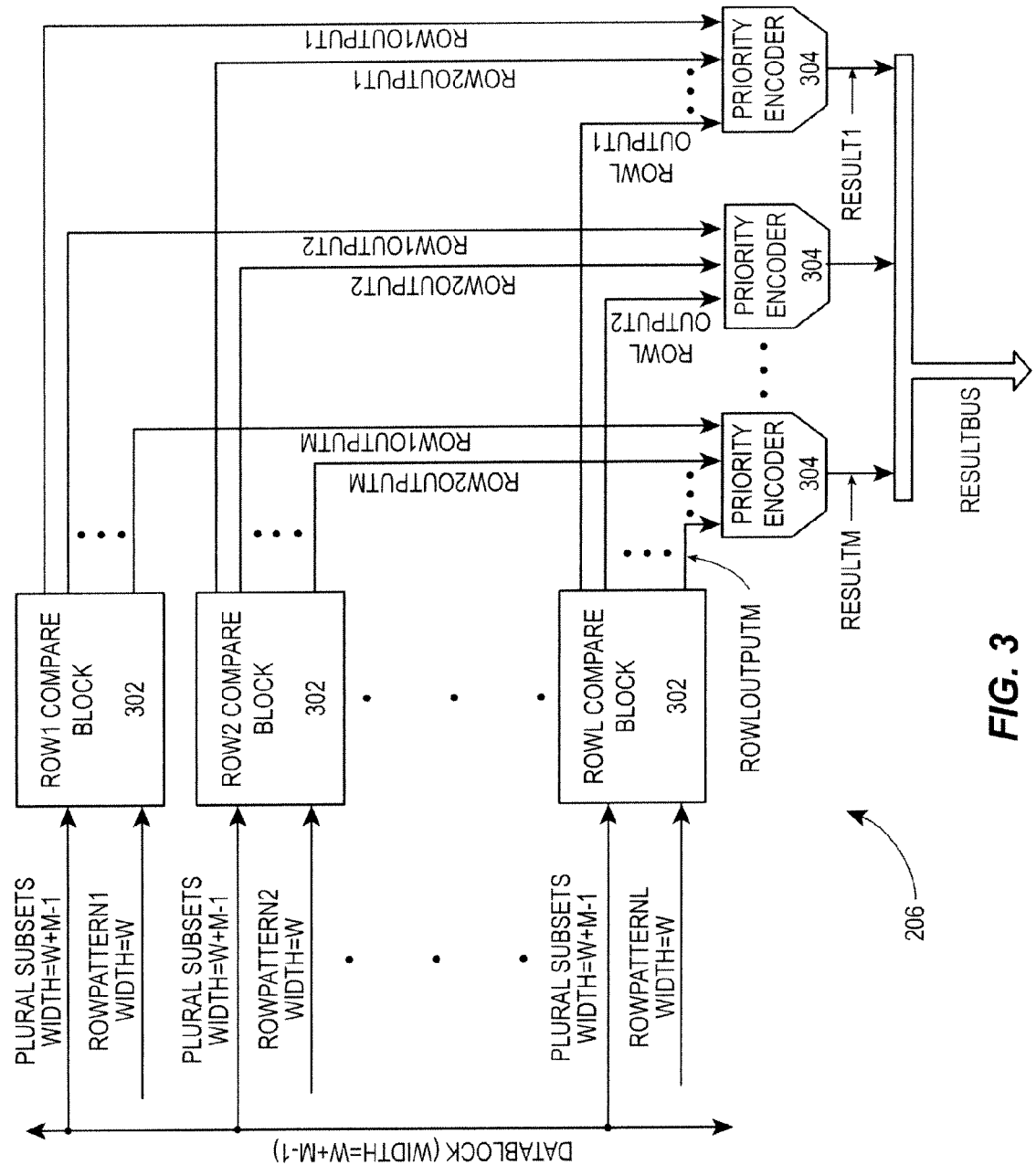
FIG. 3 is a block diagram of an example compare logic block that could be used with the pattern matcher of FIG. 2.

FIG. 3 is a block diagram of an example compare logic block 206 that could be used with the pattern matcher 104 of FIG. 2. Of course, the pattern matcher 104 could utilize another suitable compare logic block. Similarly, the compare logic 206 of FIG. 3 could be used in pattern matchers other than the pattern matcher 104.

FIG. 3 illustrates that the bus DATABLOCK is coupled to the compare logic 206. In this particular implementation, the DATABLOCK bus has a width of W+M−1. The compare logic 206 includes L row compare blocks 302, one for each of L rows in the CAM 202. In this implementation, each row compare block 302 has a first bus input coupled to the DATABLOCK bus. Additionally, each row compare block 302 has a second bus input coupled to a corresponding one of the L row pattern busses. As will be discussed in more detail below, each row compare block 302 simultaneously compares multiple different subsets of the width-(W+M−1) DATABLOCK with one of the width-W L row pattern busses, and provides comparison results on M outputs: OUTPUT1, OUTPUT2, ..., OUTPUTM. In particular, OUTPUT1 indicates whether a first subset corresponding to units (e.g., bits, bytes, etc.) 1 through W of the DATABLOCK matches the corresponding row. Similarly, OUTPUT2 indicates whether a second subset corresponding to units 2 through W+1 of the DATABLOCK match the corresponding row, and so on. OUTPUTM indicates whether an Mth subset corresponding to units M through W+M−1 of the DATABLOCK matches the corresponding row. Thus, in the embodiment of FIG. 3, each row compare block 302 simultaneously compares M different subsets of the DATABLOCK, each subset of width-W, to a corresponding row of the memory 202. In another embodiment, each row compare block 302 may be provided serially in a block-wise manner a plurality of different subsets and may serially compare the plurality of different subsets to the corresponding row of the memory 202. Each of at least some of the plurality of different subsets may overlap with at least one other subset (i.e., the plurality of different subsets may be partially overlapping).

Because in the embodiment of FIG. 3 each row compare block 302 is provided with the DATABLOCK, each row compare block 302 is provided, in effect, with a plurality subsets of the DATABLOCK in parallel. In the embodiment of FIG. 3, each row compare block 302 compares in parallel and/or simultaneously a plurality of subsets to the corresponding row pattern. In one embodiment, each row compare block 302 compares M different subsets to the row pattern, wherein each subset has a width W. This corresponds to each subset being a 1-byte shifted version of another subset. In other implementations, each row compare block 302 may compare less than M different subsets. For example, if M is even and the number of parallel compares is M/2, this may correspond to each subset being a 2-byte shifted version of another subset. In general, each subset that is compared may be shifted by n data units as compared to another subset, wherein is n is an integer such as 1, 2, 3, 4, etc. In these embodiments, the subsets compared by a row compare block 302 comprise a plurality of at least partially overlapping subsets. In other embodiments, the subsets compared by a row compare block 302 need not be overlapping or partially overlapping. For example, each row compare block 302 may be provided serially in a block-wise manner a plurality of different non-overlapping subsets and may serially compare the plurality of different non-overlapping subsets to the corresponding row of the memory 202.

The compare logic 206 also includes M priority encoders 304. Each priority encoder has L inputs coupled to receive one output from each of the L row compare blocks 302. Thus, each priority encoder 304 receives signals that indicate whether a corresponding subset of the DATABLOCK matches any of the rows of the CAM 202. For example, a first priority encoder 304 receives signals indicating whether units 1 through W of the DATABLOCK match any of the rows. Similarly, a second priority encoder 304 receives signals indicating whether units 2 through W+1 of the DATABLOCK match any of the rows, and so on. An M-th priority encoder 304 receives signals indicating whether units M through W+M−1 of the DATABLOCK match any of the rows.

Each priority encoder 304 generates a corresponding result signal. Each result signal could indicate information such as whether a match occurred, an indicator of the particular row for the match, an indicator for the subset in the DATABLOCK in which the match occurred, etc. If multiple matches occurred, the result signal would indicate a highest (or lowest) priority match. Priorities could be determined based on the ordering of the inputs to the priority encoder 304, for example. The result signals of all M priority encoders 304, in this embodiment, are coupled to a bus RESULTBUS. In other implementations, the priority encoders may be omitted.

Figure 4:
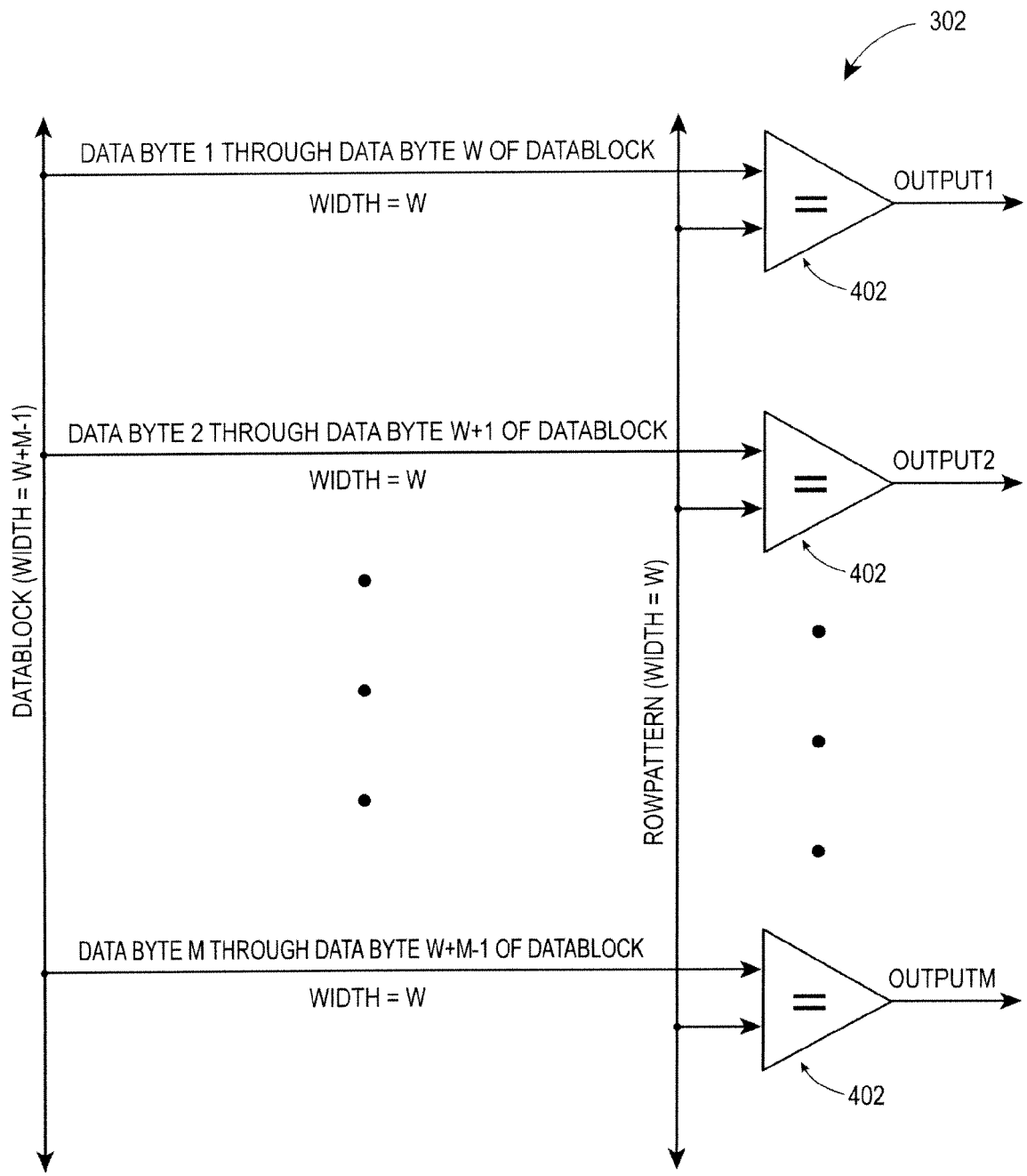
FIG. 4 is a block diagram of an example row compare block that may be utilized in the compare logic block of FIG. 3.

FIG. 4 is a block diagram of an example of row compare block 302 that may be utilized in the compare logic 206 of FIG. 3. Of course, the compare logic 206 other row compare block. Similarly, the row compare block 302 of FIG. 4 could be used in compare logic other than the compare logic 206.

For ease of explanation of FIG. 4, widths of busses will be assumed to be in bytes, although other units such as bits, words, etc., could also be used. The bus DATABLOCK has a width of W+M−1 bytes comprising consecutive bytes Data Byte 1, Data Byte 2, . . . , Data Byte W+M−1. The bus ROWPATTERN has a width of W bytes comprising consecutive bytes Row Byte 1, Row Byte 2, . . . , Row Byte W. In the row compare block 302 of FIG. 4, each of M subsets of the bus DATABLOCK are simultaneously compared with the bus ROWPATTERN. For example, Data Byte 1, Data Byte 2, . . . , Data Byte W of the bus DATABLOCK are coupled to a first comparator 402 that is also coupled to the bus ROWPATTERN. The first comparator 402 performs a byte-by-byte comparison of Data Byte 1, Data Byte 2, . . . , Data Byte W of the bus DATABLOCK with Row Byte 1, Row Byte 2, . . . , Row Byte W of the bus ROWPATTERN, respectively. A result signal OUTPUT1 is generated that indicates whether all of the byte-by-byte comparisons match. However, if at least one byte-by-byte comparisons fails to produce a match, then the signal OUTPUT1 indicates that no match was found. Similarly, a second comparator 402 performs a byte-by-byte comparison of Data Byte 2, Data Byte 3, . . . , Data Byte W, Data Byte W+1 of the bus DATABLOCK with Row Byte 1, Row Byte 2, . . . , Row Byte W of the bus ROWPATTERN, respectively. A result signal OUTPUT2 is generated that indicates whether all of the byte-by-byte comparisons match. In this manner M different result signals are generated in parallel, each result signal corresponding to a different subset of the DATABLOCK being compared to the row of the memory 202. As can be seen in the embodiment of FIG. 4, each comparator 402 receives a subset that is a one-byte-shifted version of the DATABLOCK as compared to a subset received by another of the comparators 402.

In other implementations, there may be less than M comparators 402. In these implementations, each comparator 402 may receive a subset that is shifted by more than one byte as compared to a subset received by another of the comparators 402. Except for the first and last comparators 402, a subset received by a comparator 402 will overlap with two other subsets received by other comparators 402. Similarly, in alternative embodiments in which the CAM/TCAM 208 (FIG. 2) performs sequential comparisons of a plurality of different subsets (each of at least some of the plurality of different subsets may overlap with at least one other subset), there also may be less than M comparators 402. As one example, there may be only one comparator 403 that serially receives in a block-wise manner a plurality of different subsets, each of width-W, and serially compares each subset to the width-W row data from the memory 202. As another example, there may be two comparators 403 that each serially receives in a block-wise manner a plurality of different subsets, each of width-W. In such an embodiment, each of the two comparators 403 may serially compare each subset that it receives to the width-W row data from the memory 202.

Figure 5:
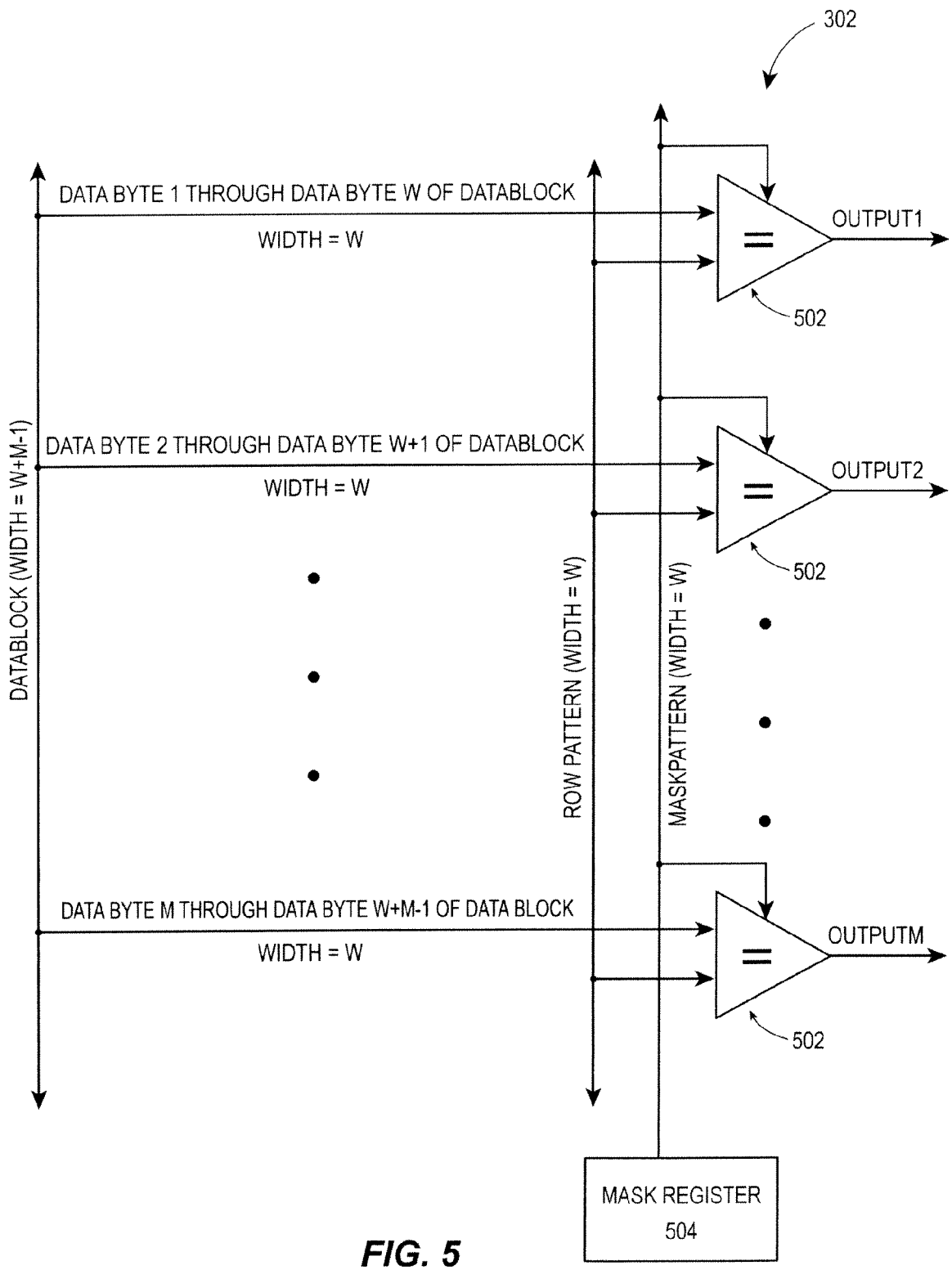
FIG. 5 is a block diagram of another example row compare block that may be utilized in the compare logic block of FIG. 3.

FIG. 5 is a block diagram of another example of row compare block 302 that may be utilized in the compare logic 206 of FIG. 3. Of course, the row compare block 302 of FIG. 5 could be used in compare logic other than the compare logic 206.

The row compare block 302 of FIG. 5 is similar to the row compare block 302 FIG. 4, but permits some byte comparisons to be treated as "don't cares." For instance, the row compare block 302 of FIG. 5 includes a mask register 504 that stores indications of bytes in the row that may be ignored when determining whether a match has occurred. The mask register 504 is coupled to control and inputs signals (not shown) that may be used to load values into the register 504. The mask register 504 stores a mask pattern of width W, which is output on a bus MASKPATTERN. The bus MASKPATTERN is coupled to each of the comparators 502. The values provided by the bus MASKPATTERN to each of the comparators 502 indicate whether a certain byte will be masked in the comparison operation. For instance, in the case where the bus MASKPATTERN indicates that a particular byte location is masked, unequal values in that byte location will not prevent the comparator 502 from determining that a match occurred. For example, if the MASKPATTERN indicates that byte 3 is masked, different values of Data Byte 3 of the bus DATABLOCK and Row Byte 3 of the bus ROWPATTERN will not prevent the comparator 502 from determining that a match occurred.

In some implementations, the compare logic 206 may have row compare blocks 302 with differing width inputs. For example, some compare blocks 302 may receive less than the full width of the bus DATABLOCK. Additionally or alternatively, some compare blocks 302 may receive row patterns having widths less than W.

Figure 6:
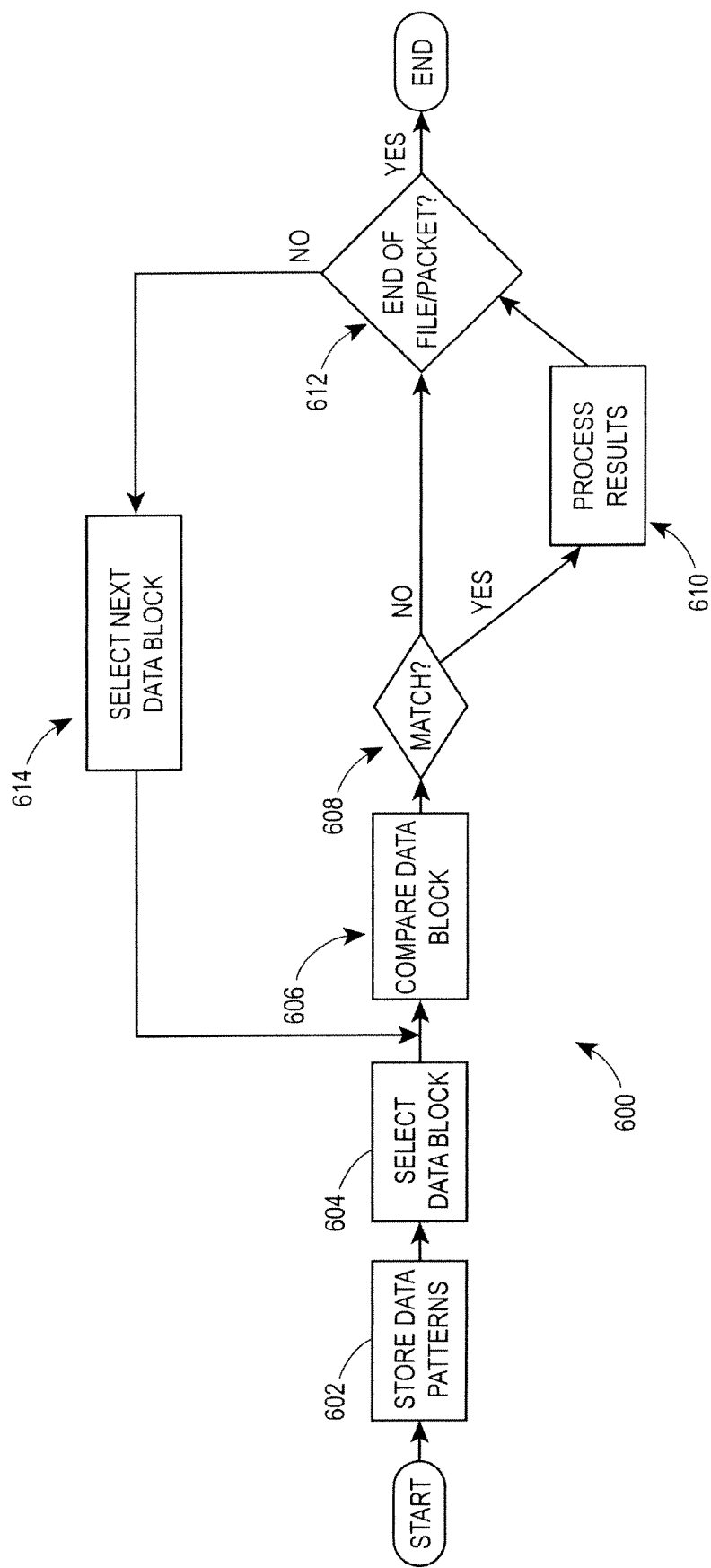
FIG. 6 is a flow diagram of an example method for detecting particular patterns in a data stream.

FIG. 6 is a flow diagram an example method 600 for detecting particular patterns in an incoming data stream. The method 600 may be implemented by the system 100 for example, and for ease of explanation, the method 600 will be described with reference to FIGS. 1 and 2. Of course, system 100 may implement a method different than the method 600. Similarly, the method 600 may be implemented by other systems as well. For ease of explanation of FIG. 6, widths of data blocks will be assumed to be in bytes, although other units such as bits, words, etc., could also be used.

At a block 602, data patterns to be detected may be stored in a memory, such as the memory 202 of the pattern matcher 104. The width of the memory may be W bytes. If the memory to store data patterns includes rows of different widths, the maximum width may be W. At a block 604, a data block in a data stream may be selected. The data block may have a width of W+M−1 bytes.

At a block 606, a plurality of subsets in the selected data block may be compared with each of the data patterns stored in the memory. The comparison may be done substantially simultaneously. In other words, all of the subsets may be compared with the data patterns substantially simultaneously, and each subset may be compared with all of the data patterns substantially simultaneously. In one implementation, M different subsets in the selected data block are compared substantially simultaneously. This corresponds to each subset being a 1-byte shifted version of another subset. In other implementations, less than M different subsets may be compared. For example, if M is even and the number of parallel compares is M/2, this may correspond to each subset being a 2-byte shifted version of another subset. Alternatively, each of at least some partially overlapping subsets (i.e., each subset overlaps with at least one other subset) may be compared with a data pattern serially. The block 606 may be implemented by the compare logic 206, for example.

At a block 608, it may be determined if a match was found as a result of the comparison operation of the block 606. If a match was found, the flow may proceed to a block 610. At the block 610, match results may be processed. For example, an indication of the detected pattern may be generated. If multiple patterns were detected, indications of all of the detected patterns, an indication of a highest priority pattern, etc., may be generated. Additionally, an indication of a position in the data stream of the detected pattern may be generated. The indication may indicate the position of the data block in the data stream and/or a position within the data block, for example.

If at the block 608 it is determined that a match was not found, and after the block 610, the flow may proceed to a block 612. At the block 612, it may be determined if there is more data to be analyzed. For example, it may be determined if an end of packet indicator, an end of file indicator, etc., has been reached. If there is no more data to analyze, the flow may end. On the other hand, if there is more data to analyze, the flow may proceed to a block 614, at which a next data block in the data stream may be selected. The next data block may have a width of W+M−1 bytes. The position of the next data block may be determined so that width-W blocks in the data stream that were previously analyzed are not analyzed again, and so that data that should be analyzed is not skipped. For example, if at the block 606 M different subsets are compared, the position of the next data block may be determined as starting M bytes after the start of the previous data block. After, the block 614, the flow may return to the block 606.

One skilled in the art will recognize that the example method 600 may be modified. For instance, blocks may be combined, omitted, reordered, etc., and/or additional blocks may be added.

Figure 7:
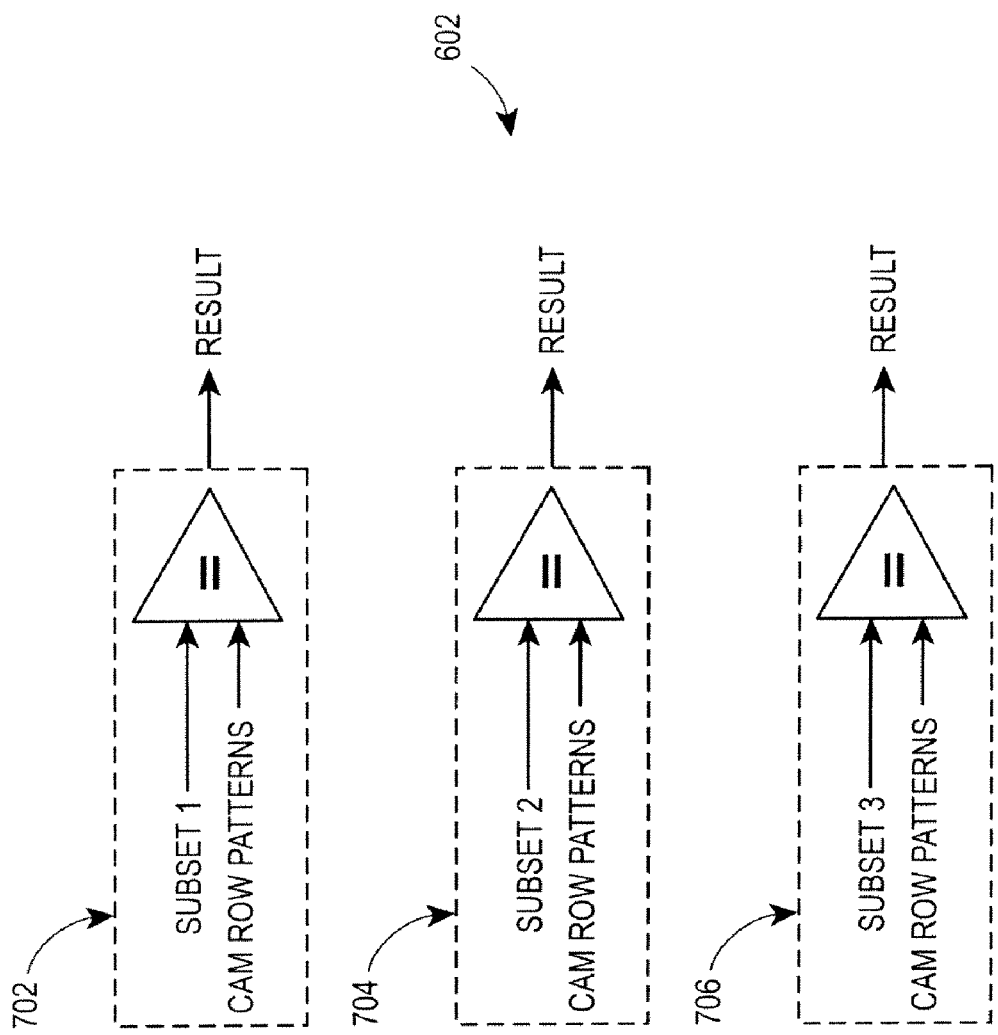
FIG. 7 is a block diagram illustrating an example of substantially simultaneous comparison operations performed in the method of FIG. 6.
Figure 8:
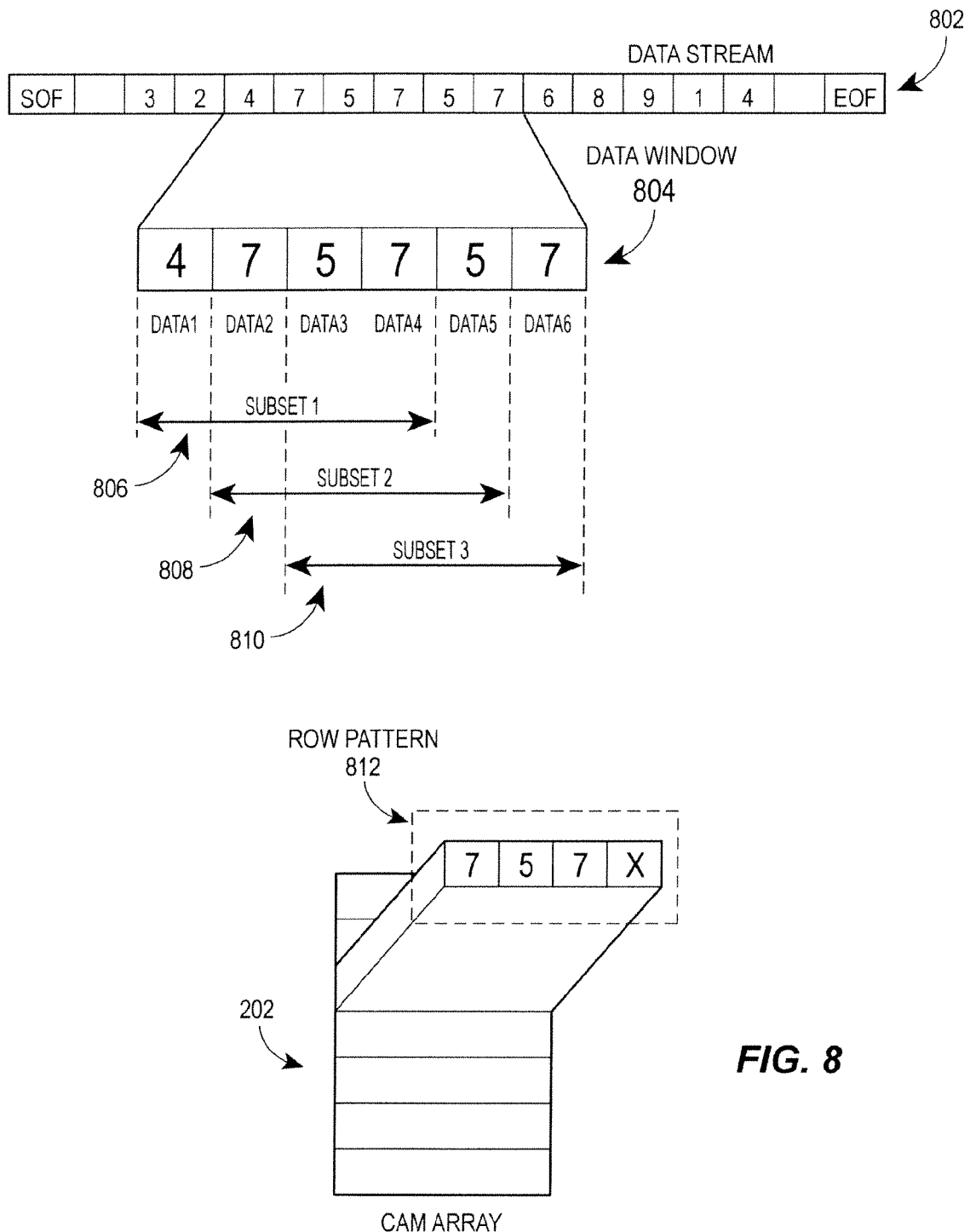
FIG. 8 is a block diagram illustrating example operations performed in the method of FIG. 6 and the block diagram of FIG. 7.

FIGS. 7 and 8 illustrate concrete examples to further explain the method 600. For these examples, the following values are assumed: W=4 bytes and M=3 bytes. Also, it is assumed that there are seven data patterns, each of width W, each data pattern being stored in a separate row of a CAM memory, for example. FIG. 7 illustrates operation of the block 602. The block 602 performs M, in this case 3, substantially simultaneous comparison operations in which each of three different subsets is compared to the seven different patterns stored in the memory. These substantially simultaneous comparisons are illustrated as blocks 702, 704 and 706. For example, at the block 702, a first subset (width W) of the data block is compared to each of the seven data patterns. At the block 704, a second subset (width W) of the data block that is partially overlapping with the first subset is compared to each of the seven data patterns. Similarly, at the block 706, a third subset (width W) of the data block that is partially overlapping with at least the second subset is compared to each of the seven data patterns. Thus, the block 602 performs 21 total comparison operations on a data block that includes the first, second and third subsets. In an embodiment, the 21 total comparisons may be performed substantially simultaneously.

FIG. 8 illustrates an example snapshot of the data values being compared in the block 602 and the blocks 702, 704 and 706. A data stream 802 is depicted that represents data from a file or packet, for example. A data window 804 represents a selected data block to be compared against the 7 data patterns that are stored in the memory. The data window 804 has a width of W+M−1, or 6, data units. The 7 data patterns are stored in a memory such as the memory 202 (FIG. 2).

A subset 806 includes data units Data 1, Data 2, Data 3, and Data 4 having values 4, 7, 5, and 7, respectively. The subset 806 may correspond to the SUBSET 1 of FIG. 7. A subset 808 includes data units Data 2, Data 3, Data 4, and Data 5 having values 7, 5, 7, and 5, respectively. The subset 808 may correspond to the SUBSET 2 of FIG. 7. A subset 810 includes data units Data 3, Data 4, Data 5, and Data 6 having values 5, 7, 5, and 5, respectively. The subset 810 may correspond to the SUBSET 3 of FIG. 7. Each of the subsets 806, 808, and 810 has a width equal to W data units. FIG. 7 also depicts the CAM 202 having 7 rows with 7 corresponding row patterns. A row pattern 812 is highlighted to show a specific row pattern in one of the rows of the memory 202. The values of row pattern 812 are 7, 5, 7, and X in that order. The value X means that for comparison purposes this value is irrelevant (i.e. this location is masked off in bus MASKPATTERN of FIG. 5) although in actuality this location in the CAM 202 may have an actual value.

The result of comparing the subset 808 with the row pattern 812 would indicate that a match had been found. However, the comparison operations of row pattern 812 would not generate a match for either of the subset 806 or the subset 810.

Figure 9:
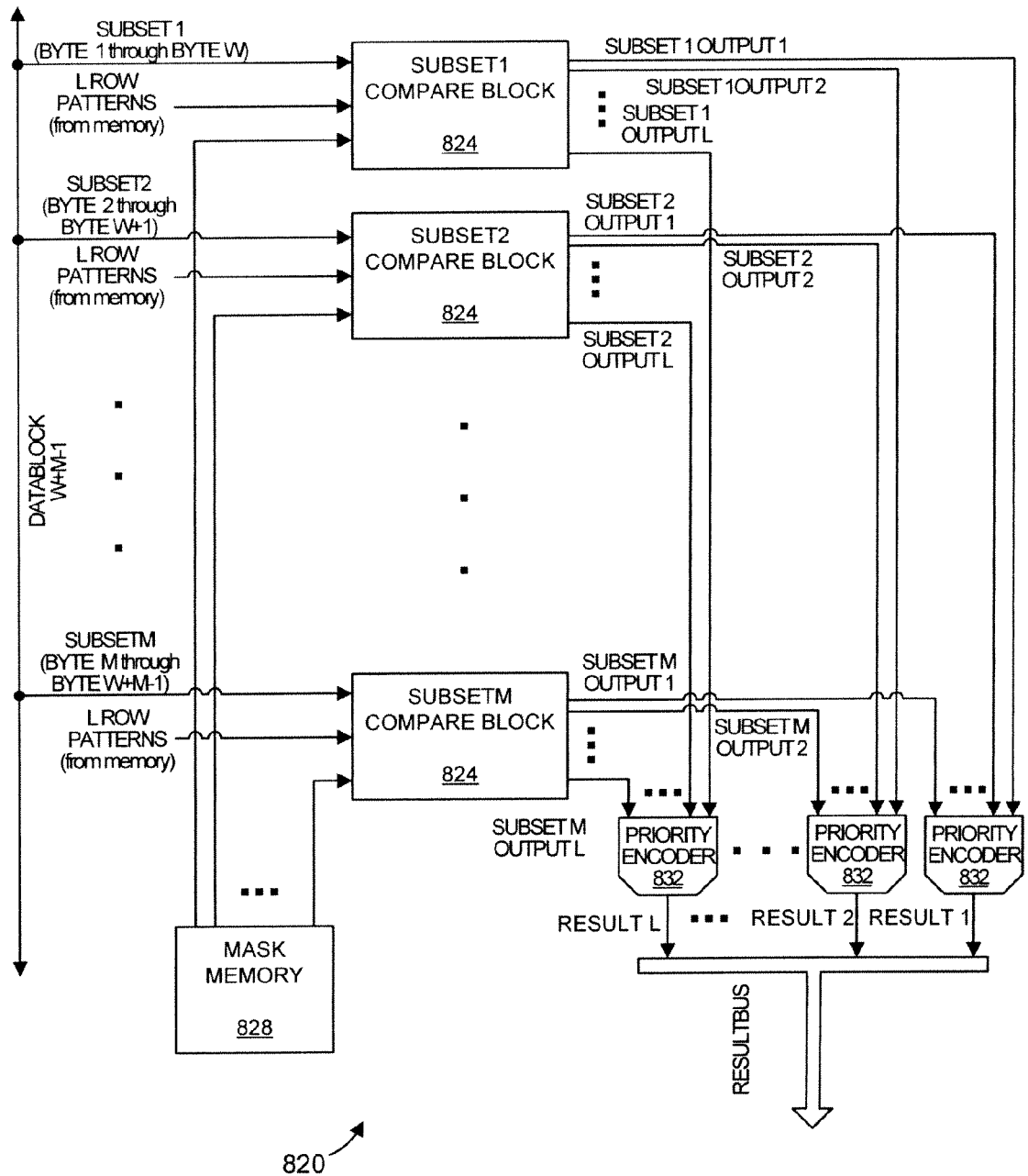
FIG. 9 is a block diagram of another example compare logic block that could be used with the pattern matcher of FIG. 2.

FIG. 9 is a block diagram of an example compare logic block 820 that could be used with the pattern matcher 104 of FIG. 2. For example, the compare logic block 820 could be used as an alternative to the compare logic block 206. Of course, the pattern matcher 104 could utilize another compare logic block. Similarly, the compare logic 820 of FIG. 9 could be used in pattern matchers other than the pattern matcher 104.

FIG. 9 illustrates that the bus DATABLOCK is coupled to the compare logic 820. In this particular implementation, the DATABLOCK bus has a width of W+M−1. The compare logic 820 includes M subset compare blocks 824, one for each M, width-W, subsets in the DATABLOCK. In this implementation, each subset compare block 824 has a first bus input coupled to the bus DATABLOCK, and a second bus input coupled to a corresponding one of the L row pattern busses that may be coupled to a CAM memory such as the memory 202 (FIG. 2). As will be discussed in more detail below, each subset compare block 824 compares a different width-W subset of the DATABLOCK with all of the width-W L row pattern busses, and provides comparison results on L outputs: OUTPUT1, OUTPUT2, ..., OUTPUTL. In particular, OUTPUT1 indicates whether a corresponding width-W subset of the DATABLOCK match row pattern 1. Similarly, OUTPUT2 indicates whether a corresponding width-W subset of the DATABLOCK match row pattern 2, and so on.

The compare logic 820 may include a mask memory 828. The mask memory 828 may include mask patterns that indicate whether any bytes of the row pattern should be ignored when determining whether there is a match.

The compare logic 820 also includes L priority encoders 832. Each priority encoder has M inputs coupled to receive one output from each of the M subset compare blocks 302. Thus, each priority encoder 832 receives signals that indicate whether a row of the memory 202 matches any of the width-W subsets of the DATABLOCK bus. For example, a first priority encoder 832 receives signals indicating whether row pattern 1 matches any of the M subsets. Similarly, a second priority encoder 832 receives signals indicating whether row pattern 2 matches any of the M subsets, and so on.

Each priority encoder 832 generates a corresponding result signal. Each result signal could indicate information such as whether a match occurred, an indicator of the particular row for the match. If multiple matches occurred, the result signal could indicate a highest (or lowest) priority match. Priorities could be determined based on the ordering of the inputs to the priority encoder 832, for example. The result signals of all M priority encoders 832, in this embodiment, are coupled to a bus RESULTBUS. In other implementations, the priority encoders may be omitted.

Figure 10:
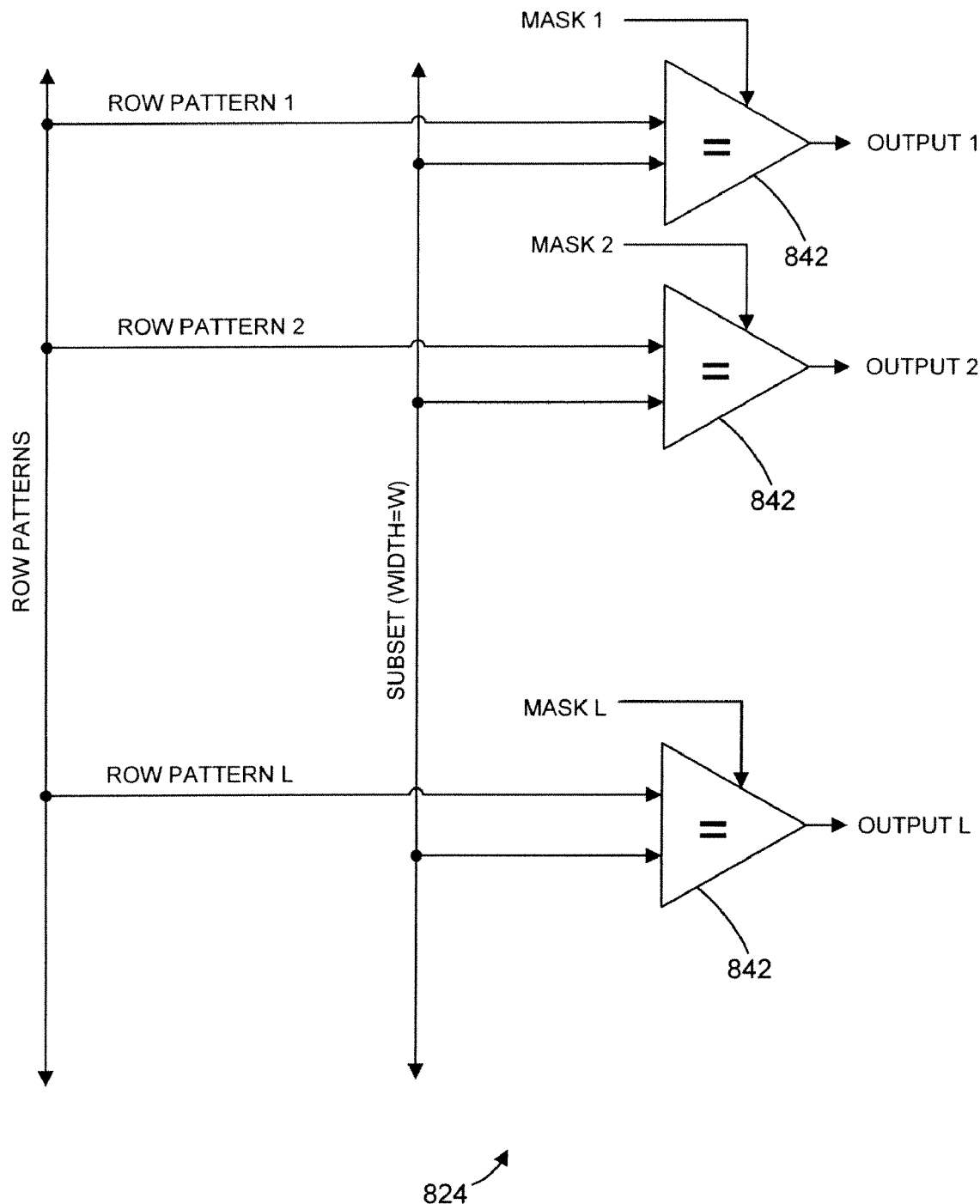
FIG. 10 is a block diagram of an example subset compare block that may be utilized in the compare logic block of FIG. 9.

FIG. 10 is a block diagram of an example of subset compare block 824 that may be utilized in the compare logic 820 of FIG. 9. Of course, the compare logic 820 could utilize another suitable subset compare block. Similarly, the subset compare block 824 of FIG. 10 could be used in compare logic other than the compare logic 820. The subset compare block 824 of FIG. 10 may be utilized for each of the blocks 824 of FIG. 9, but each block 824 in FIG. 9 would be coupled to a different width-W subset of the DATABLOCK.

For ease of explanation of FIG. 10, widths of busses will be assumed to be in bytes, although other units such as bits, words, etc., could also be used. The bus ROWPATTERN has a width of L*W bytes. In the row compare block 824 of FIG. 10, each of L row patterns are simultaneously compared with a width-W subset of the DATABLOCK bus. For example, a first input of a first comparator 842 is coupled to a row pattern 1. A second input of the first comparator 842 is coupled to a subset of the DATABLOCK bus. The first comparator 402 performs a byte-by-byte comparison of Data Byte 1, Data Byte 2, ..., Data Byte W of the row pattern 1 with the W byes of the subset of the DATABLOCK, respectively. A result signal OUTPUT1 is generated that indicates whether all of the byte-by-byte comparisons between the subset and the row pattern match. However, if at least a one byte-by-byte comparison fails to produce a match, then the signal OUTPUT1 indicates that no match was found. Similarly, a second comparator 824 performs a byte-by-byte comparison of Data Byte 1, Data Byte 2, ..., Data Byte W of the row pattern 2 with the W byes of the subset of the DATABLOCK, respectively. A result signal OUTPUT2 is generated that indicates whether all of the byte-by-byte comparisons match. However, if at least a one byte-by-byte comparison fails to produce a match, then the signal OUTPUT2 indicates that no match was found. In this manner L different result signals are generated in parallel.

Each comparator 842 also receives a corresponding mask input, which may be received from the mask memory 828 of FIG. 9. Each width-W mask input includes indications of bytes in the row pattern that may be ignored when determining whether a match has occurred. For instance, in the case where the mask input indicates that a particular byte location is masked, unequal values in that byte location will not prevent the comparator 842 from determining that a match occurred. For example, if the mask input indicates that byte 3 is masked, different values of Data Byte 3 of the DATABLOCK subset and Byte 3 of the corresponding row pattern will not cause the comparator 842 from determining that a match occurred.

In some implementations, the compare logic 824 may have subset compare blocks 842 with differing width inputs. For example, some compare blocks 842 may receive less than the full width of the DATABLOCK subset and/or the corresponding row pattern.

Figure 11A:
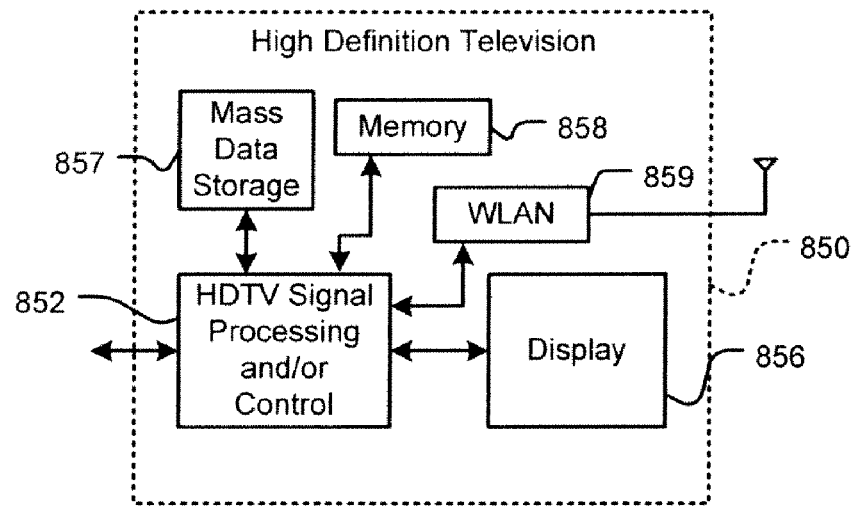
FIG. 11A is a block diagram of a high definition television that may utilize pattern matching techniques such as described herein.

Referring now to FIGS. 11A-11F, various example devices will be described that may utilize pattern matching techniques such as described above. Referring to FIG. 11A, such techniques may be utilized in a high definition television (HDTV) 850. The HDTV 850 includes signal processing and/or control circuits, which are generally identified in FIG. 11A at 852, a WLAN interface 859, and a mass data storage 857. Pattern matching techniques may be utilized in the WLAN interface 859 or the signal processing circuit and/or control circuit 852, for example. For instance, it may be desirable to detect patterns in received HDTV signals, data stored in the mass data storage 857, and/or signals received via the WLAN to detect malicious data such as viruses, worms, etc., for content filtering, for digital rights management, etc. HDTV 850 receives HDTV input signals in either a wired or wireless format and generates HDTV output signals for a display 856. In some implementations, signal processing circuit and/or control circuit 852 and/or other circuits (not shown) of HDTV 850 may process data, perform coding and/or encryption, perform calculations, format data and/or perform any other type of HDTV processing that may be required.

HDTV 850 may communicate with mass data storage 857 that stores data in a nonvolatile manner such as optical and/or magnetic storage devices. The mass data storage 857 may include one or more hard disk drives (HDDs) and/or one or more digital versatile disks (DVDs). HDTV 850 may be connected to memory 858 such as RAM, ROM, low latency nonvolatile memory such as flash memory and/or other suitable electronic data storage. HDTV 850 also may support connections with a WLAN via the WLAN network interface 859.

Figure 11B:
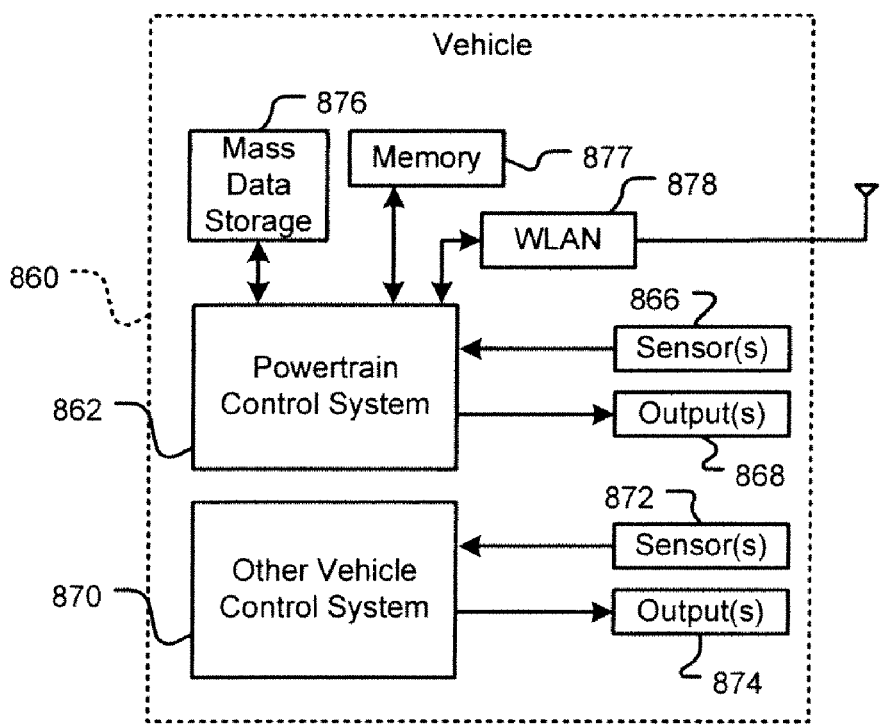
FIG. 11B is a block diagram of a vehicle that may utilize pattern matching techniques such as described herein.

Referring now to FIG. 11B, techniques such as described above may be utilized in a control system of a vehicle 860. In some implementations, a powertrain control system 862 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

A control system 870 may likewise receive signals from input sensors 872 and/or output control signals to one or more output devices 874. In some implementations, control system 870 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 862 may communicate with mass data storage 876 that stores data in a nonvolatile manner. Powertrain control system 862 may likewise receive signals from input sensors 866 and/or output control signals to one or more output devices 868. Mass data storage 876 may include optical and/or magnetic storage devices for example hard disk drives HDD and/or DVDs. Powertrain control system 862 may be connected to memory 877 such as RAM, ROM, low latency nonvolatile memory such as flash memory and/or other suitable electronic data storage. Powertrain control system 862 also may support connections with a WLAN via a WLAN network interface 878. The control system 870 may also include mass data storage, memory and/or a WLAN interface (all not shown). Pattern matching techniques such as described above may be implemented in the powertrain control system 862 and/or the WLAN interface 878. For instance, it may be desirable to detect patterns in data stored in the mass data storage 876 and/or signals received via the WLAN to detect malicious data such as viruses, worms, etc.

Figure 11C:
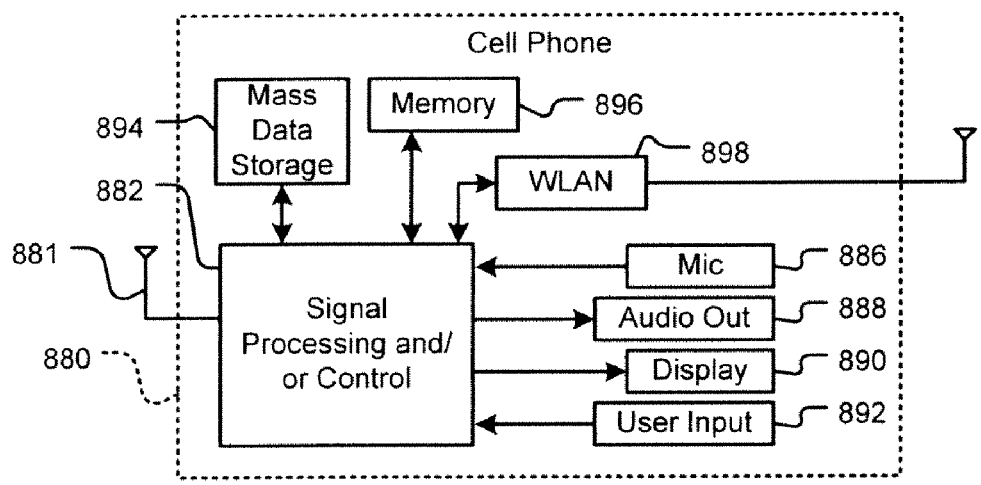
FIG. 11C is a block diagram of a cellular phone that may utilize pattern matching techniques such as described herein.

Referring now to FIG. 11C, techniques such as described above may also be utilized in a cellular phone 880 that may include a cellular antenna 881. The cellular phone 880 includes signal processing and/or control circuits, which are generally identified in FIG. 11C at 882, a WLAN interface 898, and a mass data storage 894. Pattern matching techniques may be implemented in the signal processing and/or control circuits 882 and/or the WLAN interface 898, for example. For instance, it may be desirable to detect patterns in data stored in the mass data storage 894, and/or signals received via the cell phone network or WLAN to detect malicious data such as viruses, worms, etc., for content filtering, for digital rights management, etc. In some implementations, cellular phone 880 includes a microphone 886, an audio output 888 such as a speaker and/or audio output jack, a display 890 and/or an input device 892 such as a keypad, pointing device, voice actuation and/or other input device. Signal processing and/or control circuits 882 and/or other circuits (not shown) in cellular phone 880 may process data, perform coding and/or encryption, perform calculations, format data and/or perform other cellular phone functions.

Cellular phone 880 may communicate with mass data storage 894 that stores data in a nonvolatile manner such as optical and/or magnetic storage devices for example hard disk drives HDD and/or DVDs. Cellular phone 880 may be connected to memory 896 such as RAM, ROM, low latency nonvolatile memory such as flash memory and/or other suitable electronic data storage. Cellular phone 880 also may support connections with a WLAN via a WLAN network interface 898.

Figure 11D:
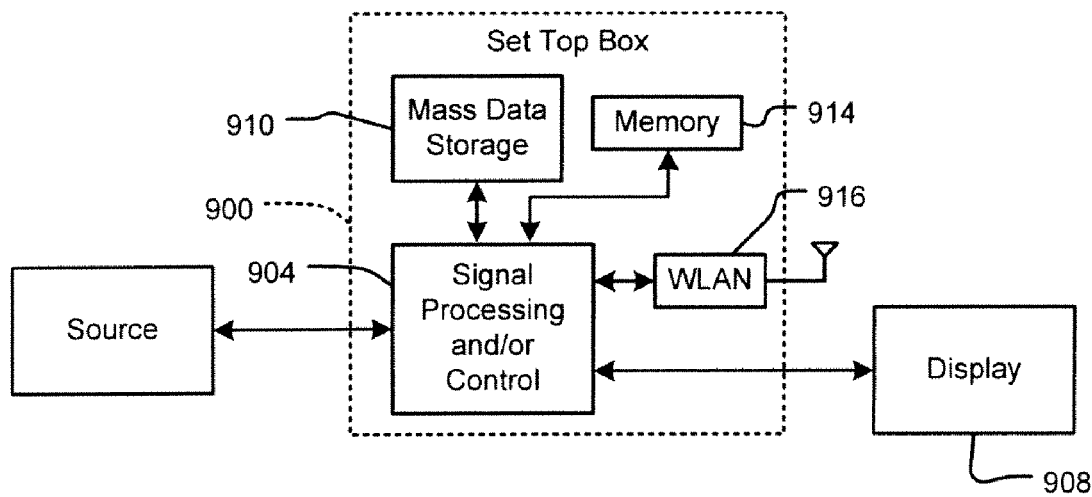
FIG. 11D is a block diagram of a set top box that may utilize pattern matching techniques such as described herein.

Referring now to FIG. 11D, techniques such as described above may be utilized in a set top box 900. The set top box 900 includes signal processing and/or control circuits, which are generally identified in FIG. 11D at 904, a WLAN interface 916, and a mass data storage device 910. Pattern matching techniques may be implemented in the signal processing and/or control circuits 904 and/or the WLAN interface 916, for example. For instance, it may be desirable to detect patterns in received television signals, data stored in the mass data storage 910, and/or signals received via the WLAN to detect malicious data such as viruses, worms, etc., for content filtering, for digital rights management, etc. Set top box 900 receives signals from a source such as a broadband source and outputs standard and/or high definition audio/video signals suitable for a display 908 such as a television and/or monitor and/or other video and/or audio output devices. Signal processing and/or control circuits 904 and/or other circuits (not shown) of the set top box 900 may process data, perform coding and/or encryption, perform calculations, format data and/or perform any other set top box function.

Set top box 900 may communicate with mass data storage 910 that stores data in a nonvolatile manner. Mass data storage 910 may include optical and/or magnetic storage devices for example hard disk drives HDD and/or DVDs. Set top box 900 may be connected to memory 914 such as RAM, ROM, low latency nonvolatile memory such as flash memory and/or other suitable electronic data storage. Set top box 900 also may support connections with a WLAN via the WLAN network interface 916.

Figure 11E:
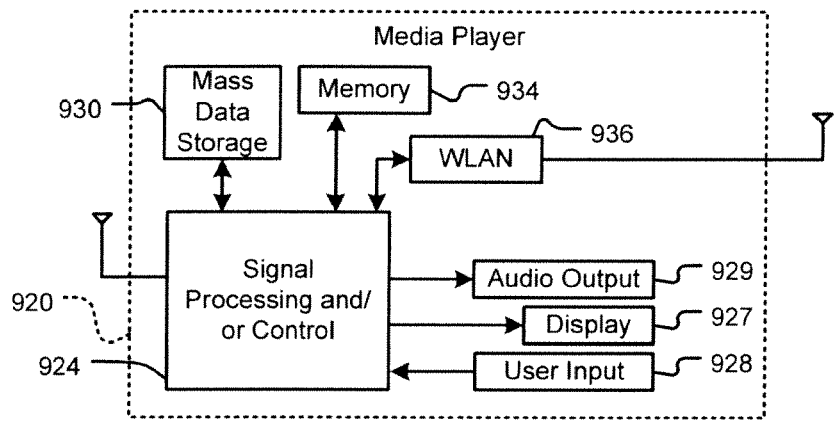
FIG. 11E is a block diagram of a media player that may utilize pattern matching techniques such as described herein.

Referring now to FIG. 11E, techniques such as described above may be utilized in a media player 920. The media player 920 may include signal processing and/or control circuits, which are generally identified in FIG. 11E at 704, a WLAN interface 936, and a mass data storage device 930. Pattern matching techniques may be implemented in the signal processing and/or control circuits 924 and/or the WLAN interface 936, for example. For instance, it may be desirable to detect patterns in data stored in the mass data storage 930, and/or signals received via the WLAN to detect malicious data such as viruses, worms, etc., for content filtering, for digital rights management, etc. In some implementations, media player 920 includes a display 927 and/or a user input 928 such as a keypad, touchpad and the like. In some implementations, media player 920 may employ a graphical user interface (GUI) that typically employs menus, drop down menus, icons and/or a point-and-click interface via display 927 and/or user input 928. Media player 920 further includes an audio output 929 such as a speaker and/or audio output jack. Signal processing and/or control circuits 924 and/or other circuits (not shown) of media player 920 may process data, perform coding and/or encryption, perform calculations, format data and/or perform any other media player function.

Media player 920 may communicate with mass data storage 930 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. Media player 920 may be connected to memory 934 such as RAM, ROM, low latency nonvolatile memory such as flash memory and/or other suitable electronic data storage. Media player 920 also may support connections with a WLAN via a WLAN network interface 936. Still other implementations in addition to those described above are contemplated.

Figure 11F:
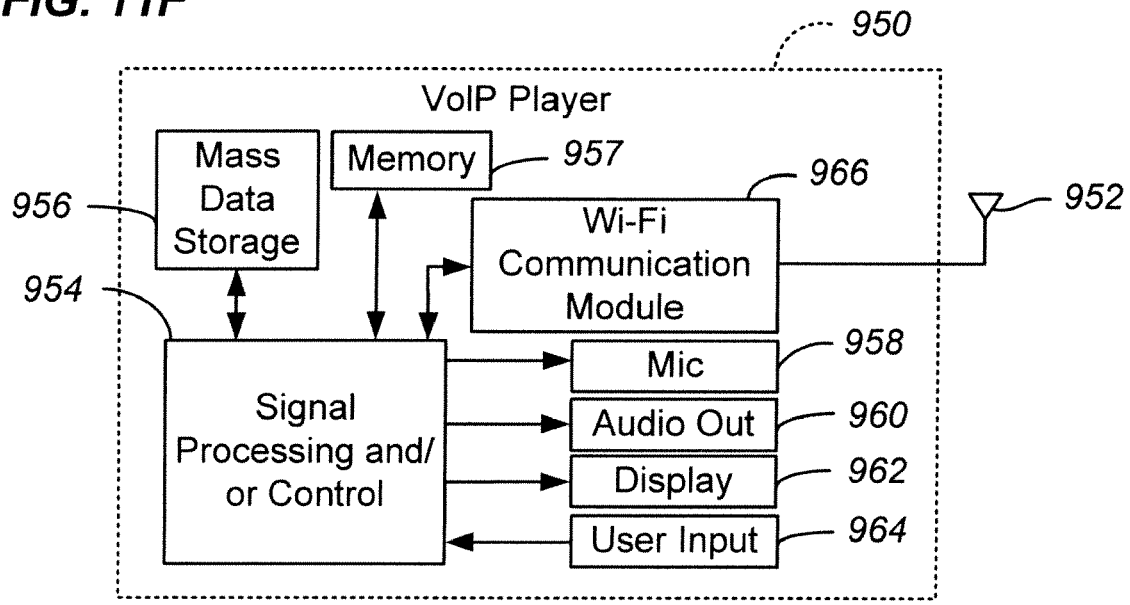
FIG. 11F is a block diagram of a voice over IP device that may utilize pattern matching techniques such as described herein.

Referring to FIG. 11F, techniques such as described above may be utilized in a Voice over Internet Protocol (VOIP) phone 950 that may include an antenna 952, signal processing and/or control circuits 954, a wireless interface 966, and a mass data storage 956. Pattern matching techniques described above may be implemented in the signal processing and/or control circuits 954 and/or the wireless interface 952, for example. For instance, it may be desirable to detect patterns in data stored in the mass data storage 857, and/or signals received via the wireless interface to detect malicious data such as viruses, worms, etc., for content filtering, for digital rights management, etc. In some implementations, VoIP phone 950 includes, in part, a microphone 958, an audio output 960 such as a speaker and/or audio output jack, a display monitor 962, an input device 964 such as a keypad, pointing device, voice actuation and/or other input devices, and a Wireless Fidelity (Wi-Fi) communication module 966. Signal processing and/or control circuits 954 and/or other circuits (not shown) in VoIP phone 950 may process data, perform coding and/or encryption, perform calculations, format data and/or perform other VoIP phone functions.

VoIP phone 950 may communicate with mass data storage 956 that stores data in a nonvolatile manner such as optical and/or magnetic storage devices, for example hard disk drives HDD and/or DVDs. VoIP phone 950 may be connected to memory 957, which may be a RAM, ROM, low latency nonvolatile memory such as flash memory and/or other suitable electronic data storage. VoIP phone 950 is configured to establish communications link with a VoIP network (not shown) via Wi-Fi communication module 966.

Other devices that may utilize pattern matching techniques such as described above include, for example, routers, switches, network attached storage (NAS) devices, mobile multimedia centers, etc.

The various blocks, operations, and techniques described above may be implemented in hardware, such as in one or more custom integrated circuits, application specific integrated circuits (ASICs), field programmable gate arrays (FPGAs), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. An apparatus for detecting patterns in a stream of data, comprising:
a memory to store a plurality of data patterns;
an interface to select data from the stream of data; and
a compare logic block coupled to the memory and the interface to compare a plurality of partially overlapping subsets of a data block from the stream of data with all of the plurality of data patterns and to generate at least one signal to indicate whether at least one of the data patterns was detected in the data block.

2. An apparatus according to claim 1, wherein the interface is configured to select the data block from the stream of data; and
wherein the compare logic block is configured to compare in parallel the plurality of partially overlapping subsets of the data block with all of the plurality of the data patterns.

3. An apparatus according to claim 1, wherein the compare logic block is configured to compare simultaneously the plurality of partially overlapping subsets of the data block with all of the plurality of the data patterns.

4. An apparatus according to claim 1, wherein the interface is configured to select sequentially the plurality of partially overlapping subsets of the data block from the stream of data; and
wherein the compare logic block is configured to compare sequentially the plurality of partially overlapping subsets of the data block with all of the plurality of the data patterns.

5. An apparatus according to claim 1, wherein the stream of data comprises a stream of packet data.

6. An apparatus according to claim 1, wherein each of at least one of the subsets in the plurality of partially overlapping subsets overlaps with at least two other subsets.

7. An apparatus according to claim 1, wherein the memory comprises a plurality of rows, wherein each data pattern in the plurality of data patterns is stored in a corresponding row;
wherein the compare logic block comprises a plurality of row compare blocks, each row compare block coupled to a corresponding row of the memory and to the interface; and
wherein each row compare block compares a first subset with the data pattern stored in the corresponding row of the memory and, in parallel, compares a second subset that partially overlaps with the first subset with the data pattern stored in the corresponding row of the memory.

8. An apparatus according to claim 7, wherein each row compare block comprises a plurality of comparators, each comparator coupled to a corresponding subset in the plurality of overlapping subsets and to the corresponding row of the memory.

9. An apparatus according to claim 8, wherein each row compare block further comprises a mask register coupled to the plurality of comparators, the mask register to store mask information;
wherein each comparator ignores one or more portions of the data pattern stored in the corresponding row of the memory when indicated by the mask information.

10. An apparatus according to claim 1, wherein the compare logic block comprises a plurality of subset compare blocks, each subset compare block coupled to a corresponding subset in the plurality of overlapping subsets and to the memory; and
wherein each subset compare block compares in parallel the corresponding subset with each of the data patterns stored in memory.

11. An apparatus according to claim 10, wherein the memory comprises a plurality of rows, wherein each data pattern in the plurality of data patterns is stored in a corresponding row;
wherein each subset compare block comprises a plurality of comparators, each comparator coupled to the corresponding subset and to a corresponding row of the memory.

12. An apparatus according to claim 11, wherein the compare logic block comprises a mask memory coupled to the pluralities of comparators of the plurality of subset compare blocks, the mask memory to store mask information for each data pattern in the memory;
wherein each comparator ignores one or more portions of the data pattern stored in the corresponding row of the memory when indicated by mask information corresponding to the data pattern.

13. An apparatus according to claim 1, wherein the memory and the compare logic block are part of a content addressable memory (CAM).

14. An apparatus according to claim 13, wherein the CAM is a ternary content addressable memory (TCAM).

15. An apparatus for detecting patterns in a stream of data, comprising:
- a memory having rows to store a plurality of data patterns, wherein the rows of the memory have a width of at least W bytes, wherein W is a positive integer;
- an interface to select a data block from the stream of data, the data block having a width of W+M−1, wherein M is a positive integer; and
- a compare logic block coupled to the memory and the interface to compare in parallel M different subsets of the data block to the plurality of data patterns and to generate at least one signal to indicate whether at least one of the data patterns was detected in the data block; wherein each subset has a width of W bytes.

16. An apparatus according to claim 15, wherein the compare logic block comprises a plurality of row compare blocks, each row compare block coupled to a corresponding row of the memory and to the interface; and
- wherein each row compare block compares in parallel the M subsets of the data block with the data pattern stored in the corresponding row of the memory.

17. An apparatus according to claim 16, wherein each row compare block further comprises a mask register to store mask information;
- wherein each compare block ignores one or more portions of the data pattern stored in the corresponding row of the memory when indicated by the mask information.

18. An apparatus for detecting patterns in a stream of data, comprising:
- a memory having rows to store a plurality of data patterns;
- a subset selector to select subsets of the stream of data; and
- a compare logic block coupled to the memory and the subset selector, the compare logic block including a plurality of compare modules for each row in the memory, wherein the compare logic block is configured to compare simultaneously, in parallel, a plurality of the subsets to the plurality of data patterns.

19. An apparatus according to claim 18, wherein the stream of data comprises a stream of data packets.

20. An apparatus according to claim 18, wherein a first subset selected by the subset selector at least partially overlaps a second subset selected by the subset selector.

21. An apparatus according to claim 18, wherein the compare logic block is configured to output a match indication when one of the plurality of data patterns is in the data stream.

* * * * *